(12) United States Patent
Denton et al.

(10) Patent No.: US 6,514,789 B2
(45) Date of Patent: *Feb. 4, 2003

(54) COMPONENT AND METHOD FOR MANUFACTURE

(75) Inventors: Heidi L. Denton, Scottsdale, AZ (US); Henry G. Hughes, Scottsdale, AZ (US); Thor D. Osborn, Everett, WA (US); DaXue Xu, North Plainfield, NJ (US)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/427,054

(22) Filed: Oct. 26, 1999

(65) Prior Publication Data

US 2002/0171131 A1 Nov. 21, 2002

(51) Int. Cl.⁷ .......................... H01L 21/44; H01L 21/48; H01L 21/00
(52) U.S. Cl. .................. 438/106; 438/118; 438/121; 438/125; 438/51; 438/55; 438/64
(58) Field of Search ............. 438/51, 55, 64, 438/106, 107, 118, 121, 125, 455, 456; 257/704

(56) References Cited

U.S. PATENT DOCUMENTS

| | | | | |
|---|---|---|---|---|
| 3,943,623 A | * | 3/1976 | Mizutani et al. | 29/854 |
| 4,600,934 A | * | 7/1986 | Aine et al. | 428/450 |
| 4,802,952 A | * | 2/1989 | Kobori et al. | 438/51 |
| 5,061,987 A | | 10/1991 | Hsia | 357/71 |
| 5,207,866 A | | 5/1993 | Lue et al. | 156/647 |
| 5,220,838 A | * | 6/1993 | Fung et al. | 29/621.1 |
| 5,317,922 A | * | 6/1994 | Bomback et al. | 73/724 |
| 5,323,051 A | | 6/1994 | Adams et al. | 257/417 |
| 5,369,057 A | * | 11/1994 | Lee et al. | 438/51 |
| 5,528,452 A | * | 6/1996 | Ko | 361/283.4 |
| 5,545,912 A | | 8/1996 | Ristic et al. | 257/417 |
| 5,668,033 A | * | 9/1997 | Ohara et al. | 148/DIG. 12 |
| 5,798,557 A | * | 8/1998 | Salatino et al. | 257/416 |
| 5,895,233 A | * | 4/1999 | Higashi et al. | 438/107 |
| 6,265,246 B1 | * | 7/2001 | Ruby et al. | 438/113 |

FOREIGN PATENT DOCUMENTS

| | | |
|---|---|---|
| EP | 0855748 | 7/1998 |
| JP | 8022941 | 1/1996 |
| JP | 9260745 | 10/1997 |

OTHER PUBLICATIONS

Patent Abstracts of Japan, vol. 1996, No. 5, May 31, 1996.
Patent Abstracts of Japan, vol. 1998, No. 2, Jan. 30, 1998.

* cited by examiner

Primary Examiner—Matthew Smith
Assistant Examiner—Lex H. Malsawma

(57) ABSTRACT

A component (10) includes a substrate (15), a cap wafer (23), and a protection layer (28) formed over a surface of the cap wafer (23). Together, the protection layer (28) and the cap wafer (23) form a cap structure (39) that is bonded to the substrate (15) via a bonding layer (33). An opening (47) is formed in the cap wafer (23) by etching the cap wafer (23). The protection layer (28) provides protection during etching of the cap wafer (23) for the underlying bonding layer (33) and devices (11,12) formed in the substrate (15).

11 Claims, 1 Drawing Sheet

COMPONENT AND METHOD FOR MANUFACTURE

FIELD OF THE INVENTION

The present invention relates, in general, to electronic components and, more particularly, to protection of electronic devices using cap wafers.

BACKGROUND OF THE INVENTION

Due to their size, devices such as microelectronic sensors and integrated circuits are vulnerable to damage from handling, small particles, and moisture. Micromachined devices are typically placed in an enclosure to protect them during operation. One prior art component includes a cap wafer bonded to a semiconductor substrate for enclosing and hermetically sealing an electronic sensor from the environment. Holes are formed in the cap wafer prior to bonding the cap wafer to the substrate. Holes in the cap wafer provide for electrically connecting the sensor to external circuitry.

The holes in the cap wafer may weaken the mechanical structural reliability of the cap wafer. One solution to this problem is to increase the thickness of the cap wafer so that the structural integrity of the cap wafer is improved. However, increasing the thickness of the cap wafer also increases the size and cost of the microelectronic device.

Accordingly, it would be advantageous to have a component that provides protection to micromachined devices therein during operation. It would be of further advantage for the component to be size and cost efficient. In addition, it would be advantageous to have a method for manufacturing the component that is compatible with standard semiconductor processes.

DETAILED DESCRIPTION OF THE DRAWINGS

Figure 1:
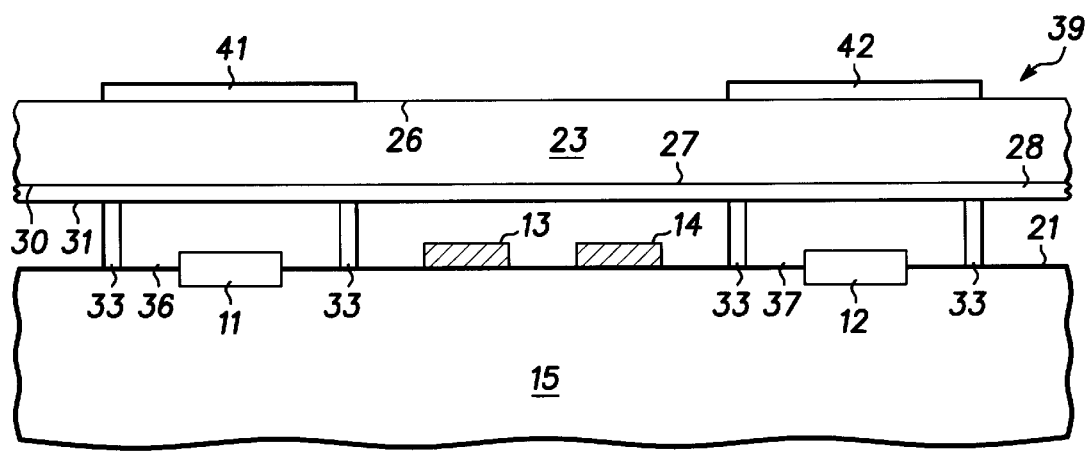
FIG. 1 is a cross-sectional view of a portion of a component during processing in accordance with an embodiment of the present invention.

FIG. 1 is a cross-sectional view of a portion of a component 10 during processing in accordance with the present invention. In this embodiment, component 10 is a semiconductor component that includes devices 11 and 12 formed in a substrate 15. Component 10 further includes conductive traces 13 and 14 formed on a surface 21 of substrate 15. Substrate 15 comprises a semiconductor material such as, for example, silicon. Devices 11 and 12 can be integrated circuits or micromachined transducers such as pressure sensors or accelerometers. Although devices 11 and 12 are shown formed in substrate 15, this is not a limitation of the present invention. Devices 11 and 12 can also be formed on surface 21 of substrate 15.

Conductive traces 13 and 14 are formed by disposing a layer of electrically conductive material on surface 21 and patterning this conductive material using photolithographic and etch techniques. For example, conductive traces 13 and 14 may be formed by coating the electrically conductive material with a layer of photoresist (not shown), exposing the portions of the electrically conductive material to be removed (using, for example, photolithographic techniques), and etching the exposed portions of the electrically conductive material. Suitable conductive materials for conductive traces 13 and 14 include copper, aluminum, copper alloys, aluminum alloys, or the like.

Component 10 includes a cap wafer 23 having a top surface 26 and a bottom surface 27. Cap wafer 23 comprises a semiconductor material such as, for example, silicon. Other suitable materials for cap wafer 23 include glass, quartz, polymer, or metal. A suitable range of thicknesses for cap wafer 23 is between approximately 50 microns and approximately 600 microns.

A protection layer 28 is disposed or grown on bottom surface 27 of cap wafer 23. protection layer 28 has a top surface 30 and a bottom surface 31, wherein top surface 30 of protection layer 28 contacts bottom surface 27 of cap wafer 23. Preferably, protection layer 28 has a thickness ranging from approximately 0.2 microns to approximately 2 microns. Together, cap wafer 23 and protection layer 28 form a cap structure 39. Suitable materials for protection layer 28 include oxide or nitride.

Etch masks 41 and 42 are disposed on top surface 26 of cap wafer 23. Masks 41 and 42 are formed by disposing a layer of metal such as, for example, aluminum on top surface 26 of cap wafer 23 and pattering this metal layer using photolithographic and etch techniques. In addition to serving as masks during a subsequent etching step, masks 41 and 42 also provide electrical shielding for devices 11 and 12. Masks 41 and 42 are also referred to as masking layers and are preferably positioned over devices 11 and 12, respectively.

Cap structure 39 is bonded to substrate 15 using a layer of bonding material 33 to form cavities 36 and 37. By way of example, bonding material 33 is frit glass that is disposed on a portion of bottom surface 31 of layer 28 by screen printing. The frit glass, which is also referred to as a powder glass, is a mixture of glass particles dispersed in an organic binder or solvent. After screen printing, the frit glass is heated to volatilize the organic binder or solvent. Cap structure 39 containing the frit glass is then placed in contact with surface 21 of substrate 15. Heat is applied and the frit glass then enamels or flows to bond cap structure 39 to substrate 15 and provide cavities 36 and 37. After cap structure 39 is bonded to substrate 15, devices 11 and 12 are hermetically sealed within cavities 36 and 37, respectively. Bonding material 33, a portion of protection layer 28, and a portion of substrate 15 form walls of the hermetically sealed cavities 36 and 37. Although bonding material 33 is described as frit glass, this is not a limitation of the present invention. Bonding material 33 can also comprise gold, metal, or alkali glass. Further, other types of bonding processes can be employed to bond cap structure 39 to substrate 15. For example, anodic, eutectic, or thermocompression bonding can be employed for bonding cap structure 39 to substrate 15.

It should be noted that although the embodiment discussed herein is a semiconductor device, this is not a limitation of the present invention. The present invention can be applied to other applications such as applications using biosensors, wherein the biosensors are protected using a cap material. In these other applications, substrate 15 can be comprised of other materials such as glass, quartz, metal, etc. Preferably, cap wafer 23 and substrate 15 are formed of materials having substantially the same coefficients of thermal expansion.

Figure 2:
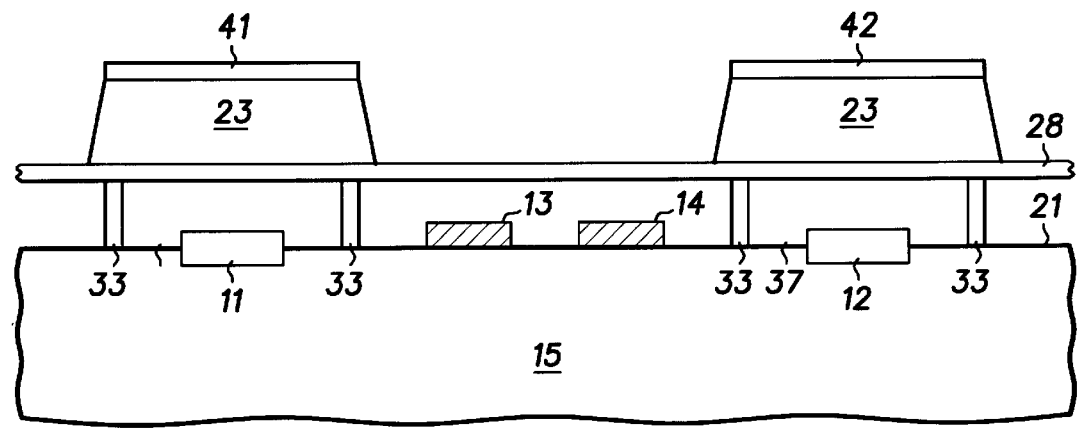
FIG. 2 is a cross-sectional view of the component of FIG. 1 at a later stage of processing.

FIG. 2 is a cross-sectional view of component 10 at a later stage of processing. It should be understood that the same reference numerals are used in the figures to denote the same elements. FIG. 2 shows component 10 after removal of portions of cap wafer 23.

A wet etch solution comprising an etchant such as, for example, tetramethylammonium hydroxide (TMAH) is utilized to etch cap wafer 23. Portions of cap wafer 23 not covered by masks 41 and 42 are removed during etching. The wet etch solution does not affect protection layer 28, which functions as an etch stop. In the embodiment shown in FIG. 2, bonding layer 33 is frit glass which can be damaged by a wet etch solution comprising TMAH. Protection layer 28 serves as an etch stop layer for protecting bonding layer 33 during etching of cap wafer 23. Preferably, protection layer 28 comprises a material that is resistant to a wet etch solution comprising TMAH. Suitable materials for protection layer 28 include oxide or nitride.

Figure 3:
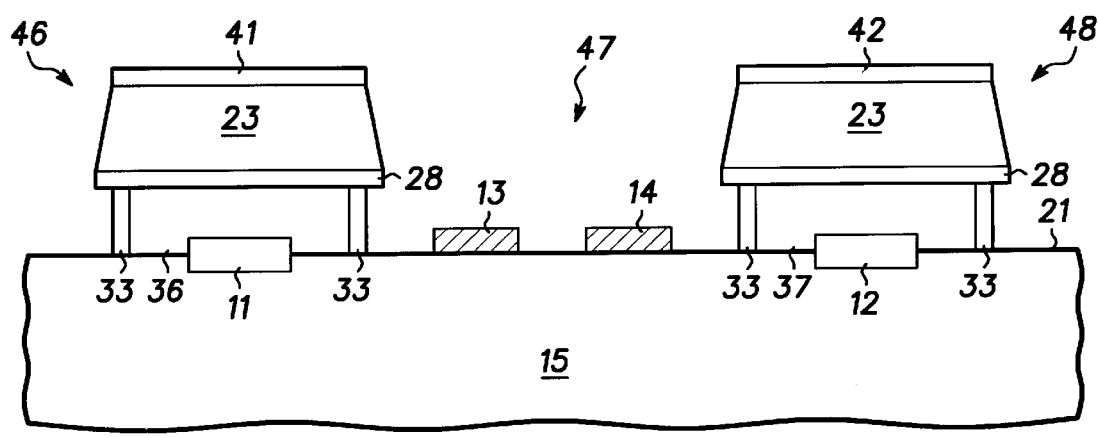
FIG. 3 is a cross-sectional view of the component of FIG. 2 at an even later stage of processing.

FIG. 3 is a cross-sectional view of component 10 at an even later stage of processing. FIG. 3 shows component 10 after removal of portions of protection layer 28.

Openings 46, 47, and 48 can also be formed using a dry etch process such as a Reactive Ion Etch (RIE) or a Deep Reactive Ion Etch (DRIE) with either a chlorine or fluorine based chemistry. The portions of protection layer 28 underlying masks 41 and 42 are not removed during the dry etch process. The diameter of opening 47 can range between approximately 500 microns and 2000 microns. Opening 47 provides for electrical connection to conductive traces 13 and 14. For example, bond wires (not shown) may be coupled to conductive traces 13 and 14 through opening 47. Although not shown, conductive traces 13 and 14 can be used to electrically couple devices 11 and 12 to other portions of component 10.

As discussed hereinbefore, protection layer 28 is disposed on bottom surface 27 of cap wafer 23 to provide protection for bonding layer 33, which can be damaged during a chemical wet etch. Alternatively, component 10 can be formed without protection layer 28 and openings 46, 47, and 48 can be formed using a single etching step. For example, if protection layer 28 is omitted, then cap wafer 23 can be etched using a single etching step that includes using either an appropriate wet etch or dry etch process. When protection layer 28 is not included in component 10, bonding layer 33 is disposed on a portion of bottom surface 27 of cap wafer 23 and cap wafer 23 is bonded to substrate 15 via bonding layer 33. Cavities 36 and 37 are formed by cap wafer 23, bonding layer 33, and substrate 15.

It should be noted that cavities 36 and 37 are not necessary in all cases. For example, bonding layer 33 can surround and contact devices 11 and 12.

Because openings 46, 47, and 48 are formed after cap structure 39 and substrate 15 are bonded together, cap wafer 23 can be a relatively thin wafer, thereby decreasing the overall stack thickness of component 10. For example, cap wafer 23, which is comprised of silicon, can have a thickness of less than approximately 50 microns. prior art silicon cap wafers typically have thicknesses of greater than 375 microns. Further, forming openings 46, 47, and 48 after cap wafer 23 is bonded to substrate 15 simplifies the layout and manufacturing of component 10.

By now it should be appreciated that a component and method for manufacturing the component is provided. The present invention provides a component that provides for protection of its elements during operation. The method of the present invention is compatible with standard semiconductor processes including CMOS processes. Further, the method reduces the number of processing steps for manufacturing a component having a cap wafer.

What is claimed is:

1. A method for manufacturing a component, comprising:

providing a substrate having interconnect formed thereon;

providing a cap wafer;

disposing a protection layer over a surface of the cap wafer;

disposing a bonding layer over a portion of the protection layer;

using the bonding layer for attaching the cap wafer and protection layer to the substrate; and forming an opening in the cap wafer and protection layer to expose the interconnect on the substrate after attaching the protection layer to the substrate.

2. The method of claim 1, wherein a micromachined device in the substrate is enclosed within a cavity formed by the bonding layer, the protection layer, and the substrate.

3. The method of claim 1, wherein the step of forming the opening includes etching the cap wafer using a wet etch solution, wherein the protection layer is formed of a material that is resistant to the wet etch solution so that the protection layer serves as an etch stop layer for protecting the bonding layer during etching of the cap wafer.

4. The method of claim 3, further including the step of disposing a masking layer over a portion of a second surface of the cap wafer, wherein portions of the cap wafer not covered by the masking layer are removed during etching of the cap wafer.

5. The method of claim 3, wherein the wet etch solution comprises tetramethylammonium hydroxide (TMAH).

6. The method of claim 1, wherein the bonding layer comprises frit glass, the cap wafer comprises silicon, the substrate comprises silicon, and the protection layer comprises oxide or nitride.

7. The method of claim 1, further including the step of disposing a conductive layer over the surface of the substrate, wherein the opening provides for electrical connection to the conductive layer.

8. A method for manufacturing a component, comprising the steps of:

bonding a cap to a substrate using a bonding material to form a hermetically sealed cavity, wherein the hermetically sealed cavity is formed by the bonding material, the cap and the substrate, the substrate has an interconnect layer formed thereon, and bonding material is frit glass; and forming an opening in the cap after bonding the cap to the substrate to expose the interconnect layer.

9. The method of claim 8, wherein the step of forming an opening includes etching the cap and further including the step of disposing an etch stop layer over a surface of the cap for protecting the bonding material during etching of the cap.

10. The method of claim 9, wherein the etch stop layer comprises nitride.

11. The method of claim 9, wherein the etch stop layer comprises oxide.

* * * * *